United States Patent
Hatakeyama et al.

(10) Patent No.: US 9,274,425 B2
(45) Date of Patent: *Mar. 1, 2016

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Kazuhiro Katayama, Joetsu (JP); Seiichiro Tachibana, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/493,625

(22) Filed: Sep. 23, 2014

(65) Prior Publication Data

US 2015/0099228 A1  Apr. 9, 2015

(30) Foreign Application Priority Data

Oct. 4, 2013  (JP) ................................. 2013-209487

(51) Int. Cl.
| | |
|---|---|
| G03F 7/075 | (2006.01) |
| G03F 7/039 | (2006.01) |
| G03F 7/20 | (2006.01) |
| G03F 7/30 | (2006.01) |
| G03F 7/11 | (2006.01) |
| C09D 183/00 | (2006.01) |
| C09D 183/14 | (2006.01) |
| H01L 21/027 | (2006.01) |

(52) U.S. Cl.
CPC .............. *G03F 7/075* (2013.01); *C09D 183/00* (2013.01); *C09D 183/14* (2013.01); *G03F 7/039* (2013.01); *G03F 7/11* (2013.01); *G03F 7/2002* (2013.01); *G03F 7/2037* (2013.01); *G03F 7/30* (2013.01); *H01L 21/0271* (2013.01)

(58) Field of Classification Search
CPC .... C09D 183/00; C09D 183/14; G03F 7/075; G03F 7/0752; G03F 7/11; H01L 21/0271
USPC .................. 430/270.1, 272.1, 322, 329, 434; 252/182.12
See application file for complete search history.

(56) References Cited

U.S. PATENT DOCUMENTS

| | | | |
|---|---|---|---|
| 5,534,312 A | 7/1996 | Hill et al. | |
| 6,169,119 B1 * | 1/2001 | Ryang et al. | 516/90 |
| 6,849,305 B2 | 2/2005 | Bravo-Vasquez et al. | |
| 7,067,346 B2 * | 6/2006 | Hill et al. | 438/57 |
| 7,074,640 B2 * | 7/2006 | Maloney et al. | 438/82 |
| 7,537,880 B2 | 5/2009 | Harada et al. | |
| 8,029,974 B2 * | 10/2011 | Ogihara et al. | 430/270.1 |
| 8,501,386 B2 * | 8/2013 | Ogihara et al. | 430/270.1 |
| 8,652,750 B2 * | 2/2014 | Ogihara et al. | 430/270.1 |
| 8,674,048 B2 * | 3/2014 | Horstman et al. | 528/10 |
| 8,852,844 B2 * | 10/2014 | Ogihara et al. | 430/270.1 |
| 2004/0238410 A1 * | 12/2004 | Inoue et al. | 208/213 |
| 2009/0136869 A1 * | 5/2009 | Ogihara et al. | 430/270.1 |
| 2010/0086872 A1 * | 4/2010 | Ogihara et al. | 430/272.1 |
| 2013/0230656 A1 * | 9/2013 | Amako et al. | 427/387 |
| 2014/0030660 A1 | 1/2014 | Takanashi et al. | |
| 2014/0193975 A1 * | 7/2014 | Ogihara et al. | 438/702 |
| 2014/0273447 A1 * | 9/2014 | Ogihara et al. | 438/671 |
| 2014/0273448 A1 * | 9/2014 | Ogihara et al. | 438/671 |

FOREIGN PATENT DOCUMENTS

| | | |
|---|---|---|
| JP | 2008-111103 A | 5/2008 |
| TW | 201245889 A | 11/2012 |

OTHER PUBLICATIONS

Hinsberg, William, et al., "Extendibility of Chemically Amplified Resists: Another Brick Wall?", Advances in Resist Technology and Processing XX, Theodore H. Editor, Proceedings SPIE, 2003, vol. 5039, pp. 1-14, cited in Specification.

Jones, G. A. C., et al., "Fabrication of nanoscale ZnO field effect transistors using the functional precursor zinc neodecanoate directly as a negative electron beam lithography resist", J. Vac. Sci. Technol. B 27(6), Nov./Dec. 2009, pp. 3164-3168, cited in Specification.

Office Action dated Jul. 6, 2015, issued in counterpart Taiwanese Patent Application No. 103134402 (4 pages).

* cited by examiner

*Primary Examiner* — Amanda C Walke
(74) *Attorney, Agent, or Firm* — Westerman, Hattori, Daniels & Adrian, LLP

(57) ABSTRACT

A resist composition comprises a metal compound obtained from reaction of a starting metal compound having formula (A-1) or a (partial) hydrolyzate or condensate or (partial) hydrolytic condensate thereof, with a di- or trihydric alcohol having formula (A-2).

$$M(OR^{1A})_4 \qquad (A-1)$$

$$R^{2A}(OH)_m \qquad (A-2)$$

In formula (A-1), M is Ti, Zr or Hf, and $R^{1A}$ is alkyl. In formula (A-2), m is 2 or 3, $R^{2A}$ is a divalent group when m=2 or a trivalent group when m=3. The resist composition exhibits improved resolution and edge roughness when processed by the EB or EUV lithography.

6 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2013-209487 filed in Japan on Oct. 4, 2013, the entire contents of which are hereby incorporated by reference.

TECHNICAL FIELD

This invention relates to a resist composition, and more particularly to a positive resist composition adapted for the EB and EUV lithography processes; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

The current technology is approaching to the processing size which is reduced below 50 nm as minimum line width. When the processing size is so reduced, the thickness of resist film must be reduced below 100 nm, depending on the surface material of the substrate to be processed, because of such factors as the structural strength to maintain the pattern against the surface tension of developer and the adhesion strength to the substrate. On use of prior art chemically amplified resist materials intended to form high-resolution resist film, for example, no significant degradation of line edge roughness (LER) does occur with a resist film having a thickness of 150 nm, but LER is materially exacerbated when the film thickness is reduced below 100 nm.

As the feature size is reduced, image blurs due to acid diffusion become a problem (see Non-Patent Document 1). To insure resolution for fine patterns with a size of 45 nm et seq., not only an improvement in dissolution contrast as intended in the prior art is requisite, but control of acid diffusion is also important. Since chemically amplified resist compositions are designed such that sensitivity and contrast are enhanced by acid diffusion, an attempt to minimize acid diffusion by reducing the temperature and/or time of post-exposure bake (PEB) results in drastic reductions of sensitivity and contrast.

Addition of an acid generator capable of generating a bulky acid is effective for suppressing acid diffusion. It is then proposed to copolymerize a polymer with an acid generator in the form of an onium salt having polymerizable olefin.

With respect to the patterning of a resist film to a feature size of 16 nm et seq., it is believed impossible in the light of acid diffusion to form such a pattern from a chemically amplified resist film. It would be desirable to have a non-chemically amplified resist material.

A typical non-chemically amplified resist material is polymethyl methacrylate (PMMA). It is a positive resist material which increases solubility in organic solvent developer through the mechanism that the molecular weight decreases as a result of scission of the main chain upon exposure to EB or EUV. Due to the lack of cyclic structure, it has the drawbacks of poor etch resistance and substantial outgassing during exposure.

Hydrogensilsesquioxane (HSQ) is a negative resist material which turns insoluble in alkaline developer through crosslinking by condensation reaction of silanol generated upon exposure to EB or EUV. Also chlorine-substituted calixarene functions as negative resist material. Since these negative resist materials have a small molecular size prior to crosslinking and are free of blur by acid diffusion, they exhibit reduced edge roughness and very high resolution. They are thus used as a pattern transfer material for representing the resolution limit of the exposure tool. However, since these materials are negative resists, bright patterns, which are sensitive to defects in a multilayer mask, must be used when it is desired to form hole patterns.

There is a demand for a non-chemically amplified positive resist material having a high resolution.

The EB writing of a resist film encounters a problem that the point of writing is shifted by electrostatic charges on the resist film. It is proposed to overlay the resist film with an antistatic film to prevent the resist film from being charged. Undesirably coating of the antistatic film adds to the cost of the overall process.

It was impossible to use metal-containing materials as the photoresist material for the semiconductor lithography because of a possible malfunction of semiconductor devices as a result of metal atoms migrating to the substrate. However, it is known in the application other than the semiconductor, for example, to use a metal compound as the resist material for LCD (see Non-Patent Document 2) or zinc neodecanoate as the patterning material for forming transparent electrode of ZnO. Patent Document 1 shows pattern-forming examples using complexes of silicon, titanium, zirconium, tantalum, barium, strontium, and hafnium with acetylacetone ligands. Patent Document 2 discloses a pattern forming method using salts of copper, chromium, cerium, yttrium, barium, and aluminum with carboxyl and amino-containing ligands. Once a pattern is formed, it is converted into a pattern of metal oxide by heat treatment at 300° C.

CITATION LIST

Patent Document 1: U.S. Pat. No. 6,849,305
Patent Document 2: U.S. Pat. No. 5,534,312
Non-Patent Document 1: SPIE Vol. 5039 p 1 (2003)
Non-Patent Document 2: J. Vac. Sci. Technol. B27(6), November/December p 3164 (2009)

DISCLOSURE OF INVENTION

An object of the invention is to provide a resist composition which has both high resolution and sensitivity, and forms a pattern with a satisfactory profile and minimal LER after exposure and development, especially a positive resist composition which has an electro-conductive function to prevent charging during imagewise writing and may use a less toxic, safe solvent; and a patterning process using the same.

In one aspect, the invention provides a resist composition comprising a metal compound obtained from reaction of at least one metal compound selected from the group consisting of a metal compound having the general formula (A-1) and a metal compound obtained from (partial) hydrolysis or condensation, or (partial) hydrolytic condensation of the metal compound of formula (A-1), with a di- or trihydric alcohol having the general formula (A-2).

$$M(OR^{1A})_4 \quad (A\text{-}1)$$

Herein M is titanium, zirconium or hafnium, and $R^{1A}$ is a straight or branched $C_1$-$C_6$ alkyl group.

$$R^{2A}(OH)_m \quad (A\text{-}2)$$

Herein m is 2 or 3, when m is 2, $R^{2A}$ is a divalent group selected from the group consisting of a straight, branched or cyclic $C_2$-$C_{20}$ alkylene, alkenylene, alkynylene or aralkylene group, a straight or branched alkylene group substituted with a cyclic alkyl, cyclic alkenyl or aryl moiety, and a straight or branched alkylene group having an intervening cyclic alkylene, cyclic alkenylene or arylene moiety, said divalent group may have a cyano moiety or be separated by a carbonyl, ester, ether, thiol or NR moiety wherein R is hydrogen or a straight or branched $C_1$-$C_6$ alkyl group, and when m is 3, $R^{2A}$ is a trivalent group corresponding to the divalent group with one hydrogen eliminated.

In another aspect, the invention provides a pattern forming process comprising the steps of coating the resist composition defined above onto a substrate, prebaking, exposing to high-energy radiation, and developing with a developer.

Preferably, the developer is alkaline water. More preferably, the developer is an aqueous solution of at least one hydroxide selected from among tetramethylammonium hydroxide, tetraethylammonium hydroxide, tetrapropylammonium hydroxide, tetrabutylammonium hydroxide, choline hydroxide, sodium hydroxide, and potassium hydroxide. Typically, the high-energy radiation is EUV radiation having a wavelength of 3 to 15 nm or EB at an accelerating voltage of 1 to 150 keV.

Advantageous Effects of Invention

The resist composition has many advantages including a high resolution and a minimal edge roughness. It may be a positive resist composition suited as the micropatterning material for fabrication of VLSIs and photomasks, and the patterning material in the EB and EUV lithography.

DESCRIPTION OF EMBODIMENTS

The terms "a" and an herein do not denote a limitation of quantity, but rather denote the presence of at least one of the referenced item. As used herein, the notation ($C_n$-$C_m$) means a group containing from n to m carbon atoms per group.

The abbreviations and acronyms have the following meaning.
UV: ultraviolet radiation
EUV: extreme ultraviolet
EB: electron beam
Mw: weight average molecular weight
PEB: post-exposure bake
LER: line edge roughness
LWR: line width roughness While the effort to reduce the pattern rule is in rapid progress to meet the demand for higher integration density and operating speed of LSIs as alluded to previously, there is a need for a resist composition which has a high resolution and forms a pattern with a satisfactory profile and minimal LER through exposure and development.

Seeking for the currently desired resist material having a high resolution and minimal LER, the inventors have found that better results are obtained from a positive resist composition comprising a partial condensate of titanium, zirconium or hafnium alkoxide having diol or triol coordinated thereto. Since these metals have high absorption to such radiation as EB or EUV, the resist composition has a high sensitivity as non-chemically amplified resist material. The resist composition comprising a partial condensate of titanium, zirconium or hafnium alkoxide having diol or triol ligand coordinated thereto works as positive tone resist in that the diol or triol ligand is eliminated upon exposure to high-energy radiation, so that the partial condensate may turn soluble in alkaline water.

The metal complex having diol ligand constitutes a non-chemically amplified molecular resist. A high resolution is available because the image blur due to acid diffusion is avoided. Since the metal complex has a small molecular size as compared with polymer-based resist materials, the occurrence of edge roughness caused by fluctuations of molecular size is minimized. For this reason, the resist composition is characterized by minimal edge roughness. In addition, because of its electric conduction, the metal complex prevents the resist film from being electrically charged during EB image writing. There is provided a resist composition, specifically positive resist composition suited as the micropatterning material for the fabrication of VLSIs and photomasks.

The resist composition of the invention is characterized by comprising a final metal compound obtained by furnishing at least one metal compound selected from among a starting metal compound having the general formula (A-1), and an intermediate metal compound obtained from (partial) hydrolysis or condensation, or (partial) hydrolytic condensation of the starting metal compound of formula (A-1), and reacting it with a ligand which is a di- or trihydric alcohol having the general formula (A-2). As used herein, the term "(partial) hydrolysis or condensation" refers to partial hydrolysis, partial condensation, hydrolysis or condensation; and the term "(partial) hydrolytic condensation" refers to partial hydrolytic condensation or hydrolytic condensation.

$$M(OR^{1A})_4 \quad (A\text{-}1)$$

Herein M is an element selected from among titanium, zirconium, and hafnium, and $R^{1A}$ is a straight or branched $C_1$-$C_6$ alkyl group.

$$R^{2A}(OH)_m \quad (A\text{-}2)$$

Herein m is 2 or 3. When m is 2, $R^{2A}$ is a divalent group selected from the group consisting of a straight, branched or cyclic $C_2$-$C_{20}$ alkylene, alkenylene, alkynylene or aralkylene group, a straight or branched alkylene group substituted with a cyclic alkyl, cyclic alkenyl or aryl moiety, and a straight or branched alkylene group having an intervening cyclic alkylene, cyclic alkenylene or arylene moiety, the divalent group may have a cyano moiety, or be separated by a carbonyl, ester, ether, thiol or NR moiety wherein R is hydrogen or a straight or branched $C_1$-$C_6$ alkyl group. When m is 3, $R^{2A}$ is a trivalent group corresponding to the divalent group with one hydrogen eliminated.

In the definition of $R^{2A}$, the alkylene group substituted with a cyclic alkyl, cyclic alkenyl or aryl moiety is an alkylene group whose hydrogen atom is substituted by a cyclic alkyl, cyclic alkenyl or aryl moiety; and the straight or branched alkylene group having an intervening cyclic alkylene, cyclic alkenylene or arylene moiety is a straight or branched alkylene group in which two hydrogen atoms bonded to a common carbon atom or hydrogen atoms bonded to two different carbon atoms are eliminated and a cyclic alkylene, cyclic alkenylene or arylene moiety intervenes instead.

The ligand is selected from di- and trihydric alcohols having formula (A-2), specifically dihydroxyl and trihydroxy compounds. Examples include ethylene glycol, propylene glycol, and the compounds shown below.

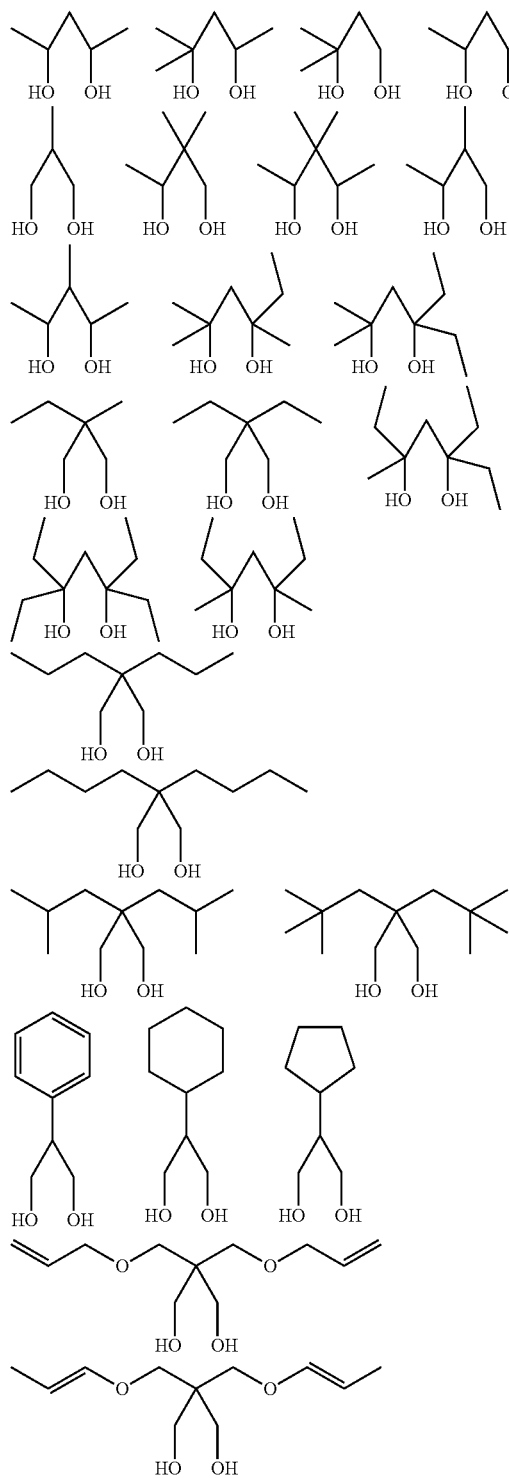

-continued

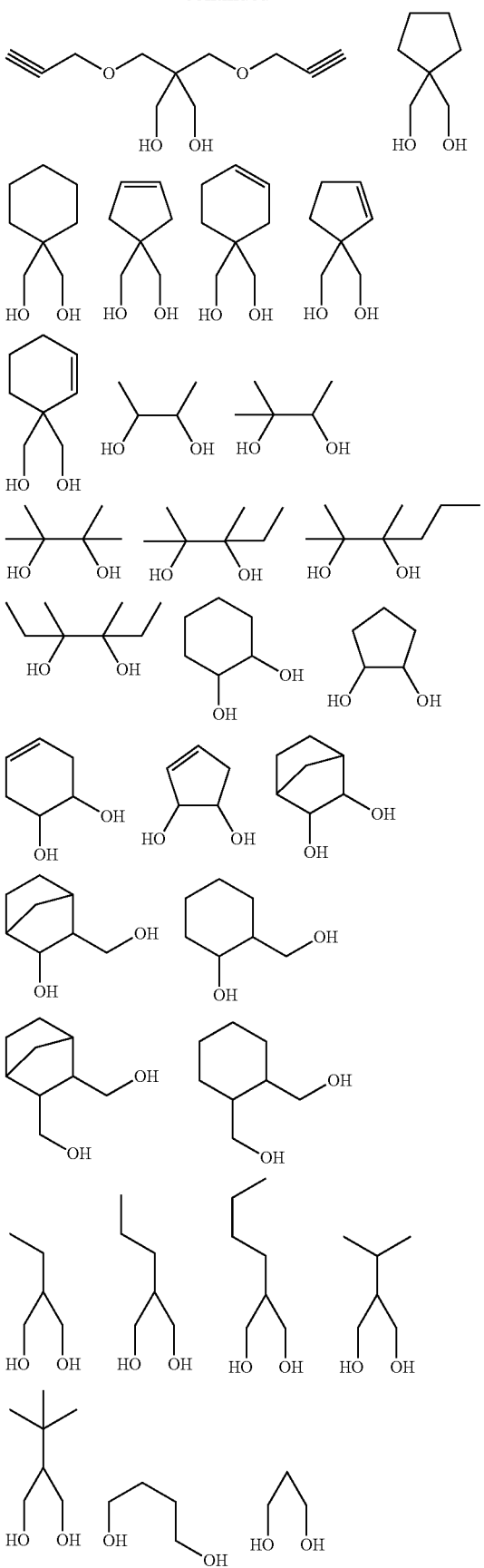

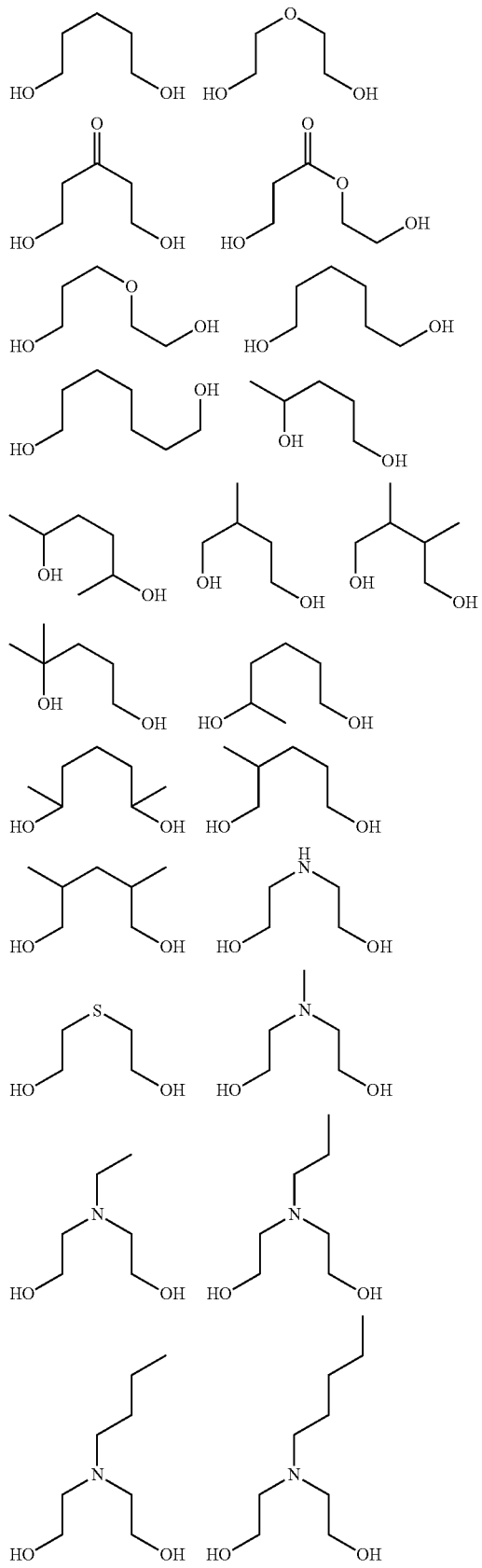
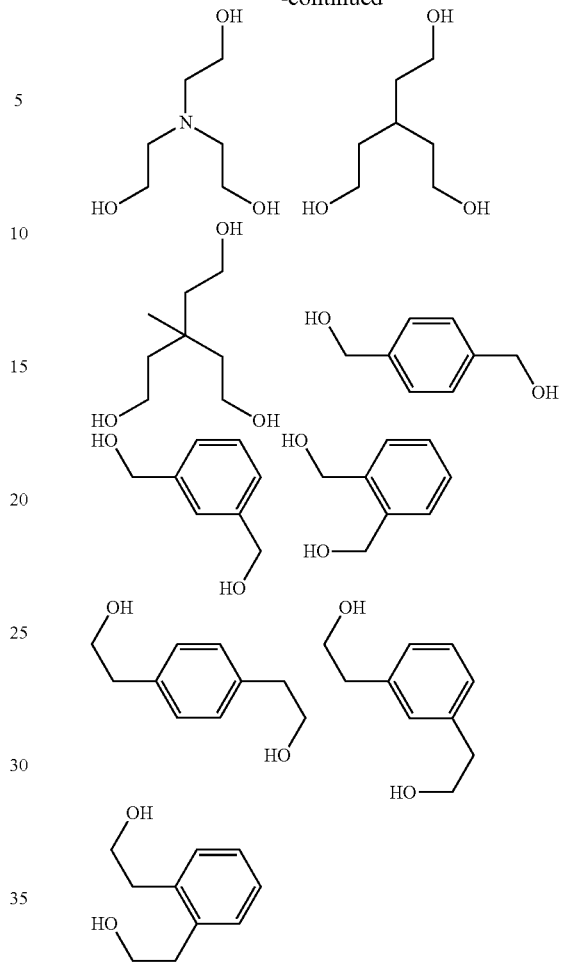

A (partial) hydrolyzate or condensate, or (partial) hydrolytic condensate of an alkoxy compound of titanium, zirconium or hafnium having formula (A-1) may be synthesized by furnishing a $C_1$-$C_6$ alkoxy compound of titanium, zirconium or hafnium, and subjecting it to (partial) hydrolysis or condensation, or (partial) hydrolytic condensation, preferably to partial hydrolysis or partial hydrolytic condensation. By partial hydrolysis, a titanium, zirconium or hafnium oxide having a residual alkoxy group(s) is synthesized. The partial hydrolyzate as such is then mixed with the diol or triol compound, whereby the $C_1$-$C_6$ alkyl group $R^{1A}$ is replaced by the di- or trivalent group $R^{2A}$. The replacement occurs more effectively if the resultant $R^{1A}OH$ is removed out of the reaction system.

With respect to the method and conditions for carrying out (partial) hydrolysis or condensation, or (partial) hydrolytic condensation of a metal compound having formula (A-1), any well-known conditions may be used. For example, a hydrolysis or condensation reaction method involving addition of water to metal alkoxide is used.

Reference is also made to the method and conditions for reacting a starting metal compound of formula (A-1) or an intermediate metal compound obtained from (partial) hydrolysis or condensation or (partial) hydrolytic condensation thereof with an alcohol of formula (A-2). According to the invention, an alcohol of formula (A-2) is added to a (partial) hydrolyzate or condensate, or (partial) hydrolytic condensate obtained as above, preferably a partial hydrolyzate or partial hydrolytic condensate resulting from hydrolysis under the above conditions. The alcohol resulting from the metal alkoxide is removed out of the system by application of vacuum, whereby the alcohol of formula (A-2) is coordinated to the metal.

The final metal compound thus obtained preferably has a weight average molecular weight (Mw) of 500 to 100,000, more preferably 700 to 50,000, as measured versus polystyrene standards by gel permeation chromatography (GPC).

In the resist composition, a (partial) hydrolyzate or condensate or (partial) hydrolytic condensate of a titanium, zirconium or hafnium alkoxide, preferably a partial hydrolyzate or partial hydrolytic condensate of a titanium, zirconium or hafnium alkoxide, to which a diol or triol compound is coordinated is essential. An alcohol of at least 5 carbon atoms may also be coordinated in addition to the diol or triol compound. Examples of the alcohol of at least 5 carbon atoms are shown below.

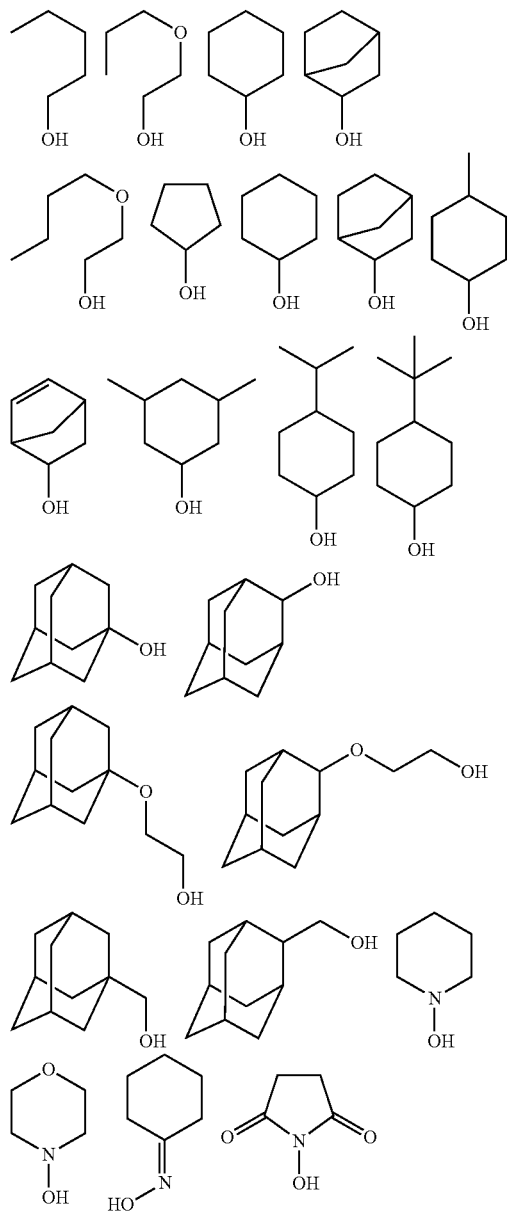

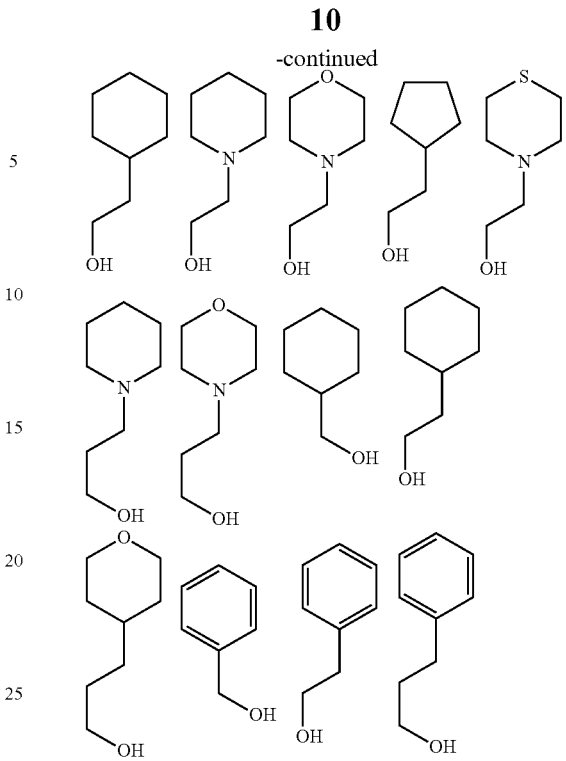

Optionally, the resist composition may comprise a solvent, which may be water or an organic solvent. Suitable organic solvents include methanol, ethanol, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-2-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, octanol, methyl lactate, ethyl lactate, propyl lactate, butyl lactate, propylene glycol, butanediol monomethyl ether, propylene glycol monomethyl ether, butanediol monoethyl ether, propylene glycol monoethyl ether, butanediol monopropyl ether, propylene glycol monopropyl ether, propylene glycol monomethoxymethyl ether, propylene glycol monomethyl ether acetate, diacetone alcohol, allyl alcohol, propargyl alcohol, 3-methyl-1-pentyn-3-ol, 3-methyl-1-butyn-3-ol, furfuryl alcohol, tetrahydrofurfuryl alcohol, and glycidol, which may be used alone or in admixture.

Optionally, the resist composition may comprise an acid generator, which is typically a compound capable of generating an acid in response to actinic light or radiation (i.e., PAG). The acid generator generates a sulfonic acid or carboxylic acid, which coordinates with the metal oxide to increase its alkaline solubility, enhancing the contrast as positive resist. On exposure to EB or EUV, the metal oxide releases a multiplicity of secondary electrons, whose energy is transferred to the acid generator to increase the decomposition efficiency of the acid generator. Thus the addition of an acid generator improves not only contrast, but also sensitivity. The PAG may be any compound capable of generating an acid upon exposure to high-energy radiation. The preferred PAGs include sulfonium salt, iodonium salt, sulfonyldiazomethane, N-sulfonyloxyimide, and oxime-O-sulfonate acid generators, which may be used alone or in admixture.

Illustrative examples of the PAG are described in JP-A 2008-111103, paragraphs [0122]-[0142] (U.S. Pat. No. 7,537,880).

As the acid generated by the acid generator exchanges with the diol or triol ligand, a metal oxide having acid coordinated thereto forms. Since this ligand exchange reaction is not a chemically amplified reaction, the influence of acid diffusion induced by exchange reaction is minimal. However, the influence (manifesting as image blur) due to diffusion of secondary electrons generated during exposure is substantial. Thus the resist composition of the invention is affected by diffusion in a different manner from chemically amplified resist compositions.

In the second aspect, the invention provides a pattern forming process comprising the steps of coating the resist composition defined above onto a substrate, baking the composition to form a resist film, exposing the resist film to high-energy radiation, and developing the exposed resist film with a developer.

Examples of the high-energy radiation include excimer lasers such as KrF, ArF, Xe, $F_2$ and $Ar_2$ excimer lasers, excimer lamps, EUV, and EB. The energy of exposure causes the diol ligand to be released, and the metal compound turns soluble in alkaline aqueous solution. The resist composition works in positive tone.

The step of exposing the resist film to high-energy radiation may use EUV having a wavelength of 3 to 15 nm, and accelerated EB at an accelerating voltage of 1 to 150 keV, preferably 5 to 120 keV, more preferably up to 50 keV, and even more preferably accelerated EB at a low accelerating voltage of up to 10 keV. Exposure to EUV and EB having a shorter wavelength and higher energy density than the excimer laser is preferred because of a higher deprotection reaction efficiency of diol ligand.

The resist composition is used in the fabrication of various integrated circuits and masks. Pattern formation using the resist composition may be performed by well-known lithography processes although the process is not limited thereto.

The resist composition is first applied onto a substrate on which an integrated circuit is to be formed or a processable layer on the substrate (e.g., Si, $SiO_2$, SiN, SiON, TiN, WSi, BPSG, SOG, or organic antireflective coating) or a substrate on which a mask circuit is to be formed or a processable layer on the substrate (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.01 to 2.0 μm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 1 $J/cm^2$, more preferably about 10 to 500 $mJ/cm^2$, or 0.1 to 1 $mC/cm^2$, more preferably 0.5 to 500 $μC/cm^2$. PEB is optional.

After exposure, the resist film is developed with a developer in the form of an aqueous base solution. Suitable developers are 0.1 to 30 wt %, preferably 0.1 to 5 wt %, and more preferably 2 to 3 wt % aqueous solutions of tetramethylammonium hydroxide (TMAH), tetraethylammonium hydroxide (TEAH), tetrapropylammonium hydroxide (TPAH), tetrabutylammonium hydroxide (TBAH), choline hydroxide, sodium hydroxide (NaOH), and potassium hydroxide (KOH). Other suitable developers are 0.1 to 30 wt % aqueous solutions of bases which include ammonia, methylamine, ethylamine, propylamine, n-butylamine, dimethylamine, diethylamine, dipropylamine, di-n-butylamine, trimethylamine, triethylamine, tri-n-propylamine, tri-n-butylamine, hydrazine, hydrazine hydrate, methylhydrazine, dimethylhydrazine, trimethylhydrazine, tetramethylhydrazine, ethylhydrazine, diethylhydrazine, propylhydrazine, butylhydrazine, phenylhydrazine, benzylhydrazine, phenethylhydrazine, cyclopropylhydrazine, cyclopentylhydrazine, cyclohexylhydrazine, ethylenediamine, 1,2-diaminopropane, 1,3-diaminopropane, 1,2-diamino-2-methylpropane, N-methylethylenediamine, N-ethylethylenediamine, N-isopropylethylenediamine, N-hexylethylenediamine, N-cyclohexylethylenediamine, N-octylethylenediamine, N-decylethylenediamine, N-dodecylethylenediamine, N,N-dimethylethylenediamine, N,N'-dimethylethylenediamine, N,N-diethylethylenediamine, N,N'-diethylethylenediamine, N,N'-diisopropylethylenediamine, N,N,N'-trimethylethylenediamine, diethylenetriamine, N-isopropyldiethylenetriamine, N-(2-aminoethyl)-1,3-propanediamine, triethylenetetramine, N,N'-bis(3-aminopropyl)ethylenediamine, N,N'-bis(2-eminoethyl)-1,3-propanediamine, tris(2-aminoethyl) amine, tetraethylenepentamine, pentaethylenehexamine, 2-(2-aminoethylamino)ethanol, N,N'-bis(hydroxyethyl)ethylenediamine, N-(hydroxyethyl)diethylenetriamine, N-(hydroxyethyl)triethylenetetramine, piperazine, 1-(2-aminoethyl)piperazine, 4-(2-aminoethyl)morpholine, polyethyleneimine, 1,3-diaminopropane, 1,4-diaminobutane, 1,3-diaminopentane, 1,5-diaminopentane, 2,2-dimethyl-1,3-propanediamine, hexamethylenediamine, 2-methyl-1,5-diaminopropane, 1,7-diaminoheptane, 1,8-diaminooctane, 2,2,4-trimethyl-1,6-hexanediamine, 2,4,4-trimethyl-1,6-hexanediamine, 1,9-diaminononane, 1,10-diaminodecane, 1,12-diaminododecane, N-methyl-1,3-propanediamine, N-ethyl-1,3-propanediamine, N-isopropyl-1,3-propanediamine, N,N-dimethyl-1,3-propanediamine, N,N'-dimethyl-1,3-propanediamine, N,N'-diethyl-1,3-propanediamine, N,N'-diisopropyl-1,3-propanediamine, N,N,N'-trimethyl-1,3-propanediamine, 2-butyl-2-ethyl-1,5-pentanediamine, N,N'-dimethyl-1,6-hexanediamine, 3,3'-diamino-N-methyldipropylamine, N-(3-aminopropyl)-1,3-propanediamine, spermidine, bis(hexamethylene)triamine, N,N',N''-trimethylbis(hexamethylene)triamine, 4-aminomethyl-1,8-octanediamine, N,N'-bis(3-aminopropyl)-1,3-propanediamine, spermine, 4,4'-methylenebis(cyclohexylamine), 1,2-diaminocyclohexane, 1,4-diaminocyclohexane, 1,3-cyclohexanebis(methylamine), 1,4-cyclohexanebis(methylamine), 1,2-bis(aminoethoxy)ethane, 4,9-dioxa-1,12-dodecanediamine, 4,7,10-trioxa-1,13-tridecanediamine, 1,3-diaminohydroxypropane, 4,4'-methylenedipiperidine, 4-(aminomethyl)piperidine, homopiperazine, 3-aminopyrrolidine, 4-aminopiperidine, 3-(4-aminobutyl)piperidine, polyallylamine, 1,8-diazabicyclo[5.4.0]-7-undecene (DBU), 1,5-diazabicyclo[4.3.0]-5-nonene (DBN), 1,4-diazabicyclo[2.2.2]octane (DABCO), 1,4,7-trimethyl-1,4,7-triazacyclononane, 1,5,9-trimethyl-1,5,9-triazacyclododecane, 1,4,8,11-tetramethyl-1,4,8,11-tetraazacyclotetradecane, and 4,4'-trimethylenebis(1-methylpiperidine). The development may be carried out usually for 3 seconds to 3 minutes, preferably 5 seconds to 2 minutes by conventional techniques such as dip, puddle or spray techniques. The resist film in the exposed area is dissolved in the developer whereas the resist film in the unexposed area is not dissolved. In this way, the desired positive pattern is formed on the substrate. Following development, the resist pattern is rinsed with deionized water and dried by spin drying.

EXAMPLE

Examples of the invention are given below by way of illustration and not by way of limitation. The abbreviation "pbw" is parts by weight. Mw is measured versus polystyrene standards by GPC.

Synthesis Example A-I

In 500 g of 2-propanol (IPA) was dissolved 284 g of titanium tetraisopropoxide. With stirring, a mixture of 27 g of deionized water and 500 g of IPA was added dropwise to the solution at room temperature over 2 hours. To the solution, 146 g of 2-ethyl-1,3-hexanediol was added, followed by stirring at room temperature for 30 minutes. The solution was concentrated in vacuum at 30° C. The concentrate was further heated to 60° C. and held at the temperature in vacuum until any distillate no longer came out. At the end of distillation, 1,200 g of 4-methyl-2-pentanol (MIBC) was added to the residue, which was heated at 40° C. in vacuum until IPA was no longer distilled out. There was obtained 1,000 g of a MIBC solution of titanium-containing compound (A-I). The compound (A-I) had a Mw of 1,000.

Synthesis Example A-II

In 500 g of IPA was dissolved 284 g of titanium tetraisopropoxide. With stirring, a mixture of 27 g of deionized water and 500 g of IPA was added dropwise to the solution at room temperature over 2 hours. To the solution, 120 g of 2-methyl-2,4-pentanediol was added, followed by stirring at room temperature for 30 minutes. The solution was concentrated in vacuum at 30° C. The concentrate was further heated to 60° C. and held at the temperature in vacuum until any distillate no longer came out. At the end of distillation, 1,200 g of MIBC was added to the residue, which was heated at 40° C. in vacuum until IPA was no longer distilled out. There was obtained 1,000 g of a MIBC solution of titanium-containing compound (A-II). The compound (A-II) had a Mw of 1,100.

Synthesis Example A-III

In 500 g of 1-butanol was dissolved 340 g of titanium tetrabutoxide. With stirring, a mixture of 27 g of deionized water and 500 g of 1-butanol was added dropwise to the solution at room temperature over 2 hours. To the solution, 132 g of 3-methyl-1,3-hexanediol was added, followed by stirring at room temperature for 30 minutes. The solution was concentrated in vacuum at 40° C. The concentrate was further heated to 60° C. and held at the temperature in vacuum until any distillate no longer came out. At the end of distillation, 1,200 g of propylene glycol monomethyl ether acetate (PGMEA) was added to the residue, which was heated at 50° C. in vacuum until 1-butanol was no longer distilled out. There was obtained 1,000 g of a PGMEA solution of titanium-containing compound (A-III). The compound (A-III) had a Mw of 1,250.

Synthesis Example A-IV

In 500 g of 1-butanol was dissolved 243 g of titanium tetrabutoxide tetramer obtained from partial hydrolysis of titanium tetrabutoxide. To the solution was added 130 g of pinacol, followed by stirring at room temperature for 30 minutes. The solution was concentrated in vacuum at 40° C. The concentrate was further heated to 60° C. and held at the temperature in vacuum until any distillate no longer came out. At the end of distillation, 1,200 g of PGMEA was added to the residue, which was heated at 50° C. in vacuum until 1-butanol was no longer distilled out. There was obtained 1,000 g of a PGMEA solution of titanium-containing compound (A-IV). The compound (A-IV) had a Mw of 1,150.

Synthesis Example A-V

In 500 g of 1-butanol was dissolved 243 g of titanium tetrabutoxide tetramer (see above). To the solution was added 146 g of 2,4-dimethyl-2,4-hexanediol, followed by stirring at room temperature for 30 minutes. Further 46 g of N-(2-hydroxyethyl)morpholine was added. The solution was concentrated in vacuum at 50° C. The concentrate was further heated to 60° C. and held at the temperature in vacuum until any distillate no longer came out. At the end of distillation, 1,200 g of PGMEA was added to the residue, which was heated at 50° C. in vacuum until 1-butanol was no longer distilled out. There was obtained 1,000 g of a PGMEA solution of titanium-containing compound (A-V). The compound (A-V) had a Mw of 1,100.

Synthesis Example A-VI

In 500 g of 1-butanol was dissolved 243 g of titanium tetrabutoxide tetramer (see above). To the solution was added 150 g of 2,4-dimethyl-2,5-hexanediol, followed by stirring at room temperature for 30 minutes. The solution was concentrated in vacuum at 50° C. The concentrate was further heated to 60° C. and held at the temperature in vacuum until any distillate no longer came out. At the end of distillation, 1,200 g of PGMEA was added to the residue, which was heated at 50° C. in vacuum until 1-butanol was no longer distilled out. There was obtained 1,000 g of a PGMEA solution of titanium-containing compound (A-VI). The compound (A-VI) had a Mw of 1,100.

Synthesis Example A-VII

In 400 g of 1-butanol was dissolved 480 g of a 80 wt % 1-butanol solution of zirconium tetraisopropoxide. With stirring, a mixture of 27 g of deionized water and 500 g of 1-butanol was added dropwise to the solution at room temperature over 2 hours. To the solution, 90 g of 1,3-butanediol was added, followed by stirring at room temperature for 30 minutes. The solution was concentrated in vacuum at 30° C. The concentrate was further heated to 60° C. and held at the temperature in vacuum until any distillate no longer came out. At the end of distillation, 1,200 g of PGMEA was added to the residue, which was heated at 40° C. in vacuum until 1-butanol was no longer distilled out. There was obtained 1,000 g of a PGMEA solution of zirconium-containing compound (A-VII). The compound (A-VII) had a Mw of 1,400.

Synthesis Example A-VIII

In 400 g of 1-butanol was dissolved 480 g of a 80 wt % 1-butanol solution of hafnium tetraisopropoxide. With stirring, a mixture of 27 g of deionized water and 500 g of 1-butanol was added dropwise to the solution at room temperature over 2 hours. To the solution, 90 g of 1,3-butanediol was added, followed by stirring at room temperature for 30 minutes. The solution was concentrated in vacuum at 30° C. The concentrate was further heated to 60° C. and held at the temperature in vacuum until any distillate no longer came out. At the end of distillation, 1,200 g of PGMEA was added to the residue, which was heated at 40° C. in vacuum until 1-butanol was no longer distilled out. There was obtained 1,000 g of a PGMEA solution of hafnium-containing compound (A-VIII). The compound (A-VIII) had a Mw of 1,500.

Comparative Synthesis Example CA-I

In 500 g of IPA was dissolved 284 g of titanium tetraisopropoxide. With stirring, a mixture of 27 g of deionized water and 500 g of IPA was added dropwise to the solution at room temperature over 2 hours. The solution was concentrated in vacuum at 30° C. The concentrate was further heated to 60° C. and held at the temperature in vacuum until any distillate no longer came out. At the end of distillation, 1,200 g of MIBC was added to the residue, which was heated at 40° C. in vacuum until IPA was no longer distilled out. There was obtained 1,000 g of a MIBC solution of titanium-containing compound (CA-I). The compound (CA-I) had a Mw of 1,300.

Comparative Synthesis Example CA-II

To a solution of 284 g of titanium tetraisopropoxide in 500 g of IPA, 150 g of 2,5-dimethyl-2,5-hexanediol was added, followed by stirring at room temperature for 30 minutes. The solution was concentrated in vacuum at 50° C. The concentrate was further heated to 60° C. and held at the temperature in vacuum until any distillate no longer came out. At the end of distillation, 1,200 g of MIBC was added to the residue, which was heated at 50° C. in vacuum until IPA was no longer distilled out. There was obtained 1,000 g of a MIBC solution of titanium-containing compound (CA-II) corresponding to titanium tetraisopropoxide whose ligand was replaced by 2,5-dimethyl-2,5-hexanediol. The compound (CA-II) had a Mw of 280.

Examples 1 to 10 and Comparative Examples 1, 2

Positive resist compositions were prepared by dissolving a diol-coordinated metal oxide (obtained in Synthesis Examples) in a solvent in accordance with the recipe shown in Table 1 and filtering the solution through a filter having a pore size of 0.2 μm. The solvent contained 100 ppm of a fluorochemical surfactant FC-4430 (3M).

The components in Table 1 are as identified below.
PGMEA: propylene glycol monomethyl ether acetate
PGPE: propylene glycol monopropyl ether
MIBC: 4-methyl-2-pentanol
Acid generator: PAG1, 2 of the following structural formulae

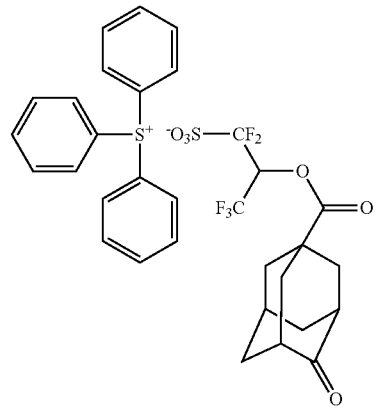

PAG 1

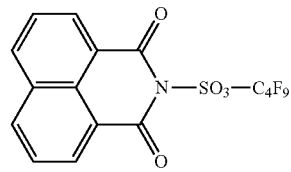

PAG 2

EB Writing Test

In the patterning test, the positive resist compositions prepared by dissolving the components as in Table 1 and filtering the solutions through a filter having a pore size of 0.2 μm were used. Silicon substrates having a diameter of 6 inches were vapor primed with hexamethyldisilazane (HMDS). Using a coater/developer system Clean Track Mark 5 (Tokyo Electron Ltd.), the positive resist composition was spin coated onto the primed silicon substrate and prebaked on a hot plate at 110° C. for 60 seconds to form a resist film of 40 nm thick. Using a system HL-800D (Hitachi, Ltd.), the resist film was irradiated imagewise with EB at a HV voltage of 50 keV in a vacuum chamber. Using the system Clean Track Mark 5, immediately after the imagewise exposure, the resist film was puddle developed with a 2.38 wt % TMAH aqueous solution for 20 seconds, yielding a positive pattern.

The pattern was evaluated as follows. Resolution was a minimum size at the exposure dose (sensitivity) that provided a 1:1 resolution of a 100-nm line-and-space pattern. The 100-nm line-and-space pattern was measured for line width roughness (LWR) under SEM.

Table 2 shows the results of sensitivity, resolution, and LWR of the resist compositions by EB lithography.

TABLE 1

| Resist | Base resin solution (pbw) | Additive (pbw) | Solvent (pbw) |
|---|---|---|---|
| Resist 1 | A-I | — | MIBC (5,000) |
| Resist 2 | A-II | — | MIBC (5,000) |
| Resist 3 | A-III | — | PGMEA (5,000) |
| Resist 4 | A-IV | — | PGMEA (5,000) |
| Resist 5 | A-V | — | PGMEA (5,000) |

TABLE 1-continued

| Resist | Base resin solution (pbw) | Additive (pbw) | Solvent (pbw) |
|---|---|---|---|
| Resist 6 | A-VI | — | PGMEA (5,000) |
| Resist 7 | A-VII | — | PGMEA (5,000) |
| Resist 8 | A-VIII | — | PGMEA (5,000) |
| Resist 9 | A-V | PAG1 (5.0) | PGMEA (5,000) |
| Resist 10 | A-V | PAG2 (5.0) | PGMEA (5,000) |
| Comparative Resist 1 | CA-I | — | MIBC (5,000) |
| Comparative Resist 2 | CA-II | — | MIBC (5,000) |

TABLE 2

| | Resist | Sensitivity ($\mu C/cm^2$) | Resolution (nm) | LWR (nm) |
|---|---|---|---|---|
| Example 1 | Resist 1 | 330 | 65 | 2.2 |
| Example 2 | Resist 2 | 380 | 55 | 2.2 |
| Example 3 | Resist 3 | 250 | 60 | 2.2 |
| Example 4 | Resist 4 | 260 | 65 | 2.2 |
| Example 5 | Resist 5 | 275 | 60 | 2.4 |
| Example 6 | Resist 6 | 280 | 55 | 2.8 |
| Example 7 | Resist 7 | 290 | 50 | 2.8 |
| Example 8 | Resist 8 | 330 | 60 | 2.1 |
| Example 9 | Resist 9 | 80 | 85 | 3.6 |
| Example 10 | Resist 10 | 120 | 80 | 3.9 |
| Comparative Example 1 | Comparative Resist 1 | no pattern formed | — | — |
| Comparative Example 2 | Comparative Resist 2 | no pattern formed | — | — |

As seen from the results of Table 2, the resist compositions within the scope of the invention exhibit a sufficient resolution and a fully reduced edge roughness. In contrast, the resist composition of Comparative Example 1 containing the metal compound without diol coordination failed to form a pattern because the dissolution of the unexposed region in alkaline developer is insufficiently inhibited. In Comparative Example 2 wherein the metal compound is not a titanium condensate despite diol coordination and has a low molecular weight, the resist composition also failed to form a pattern because the dissolution of the unexposed region in alkaline developer is insufficiently inhibited.

Japanese Patent Application No. 2013-209487 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a metal compound obtained from reaction of at least one metal compound selected from the group consisting of a metal compound having the general formula (A-1) and a metal compound obtained from (partial) hydrolysis or condensation, or (partial) hydrolytic condensation of the metal compound of formula (A-1), with a di- or trihydric alcohol having the general formula (A-2), $$M(OR^{1A})_4 \qquad (A\text{-}1)$$

wherein M is an element selected from the group consisting of titanium, zirconium, and hafnium, and $R^{1A}$ is a straight or branched $C_1$-$C_6$ alkyl group, $$R^{2A}(OH)_m \qquad (A\text{-}2)$$

wherein m is 2 or 3, when m is 2, $R^{2A}$ is a divalent group selected from the group consisting of a straight, branched or cyclic $C_2$-$C_{20}$ alkylene, alkenylene, alkynylene or aralkylene group, a straight or branched alkylene group substituted with a cyclic alkyl, cyclic alkenyl or aryl moiety, and a straight or branched alkylene group having an intervening cyclic alkylene, cyclic alkenylene or arylene moiety, said divalent group may have a cyano moiety or be separated by a carbonyl, ester, ether, thiol or NR moiety wherein R is hydrogen or a straight or branched $C_1$-$C_6$ alkyl group, and when m is 3, $R^{2A}$ is a trivalent group corresponding to the divalent group with one hydrogen eliminated.

2. A pattern forming process comprising the steps of coating the resist composition of claim 1 onto a substrate, baking, exposing to high-energy radiation, and developing with a developer.

3. The process of claim 2 wherein the developer is alkaline water.

4. The process of claim 3 wherein the developer is an aqueous solution of at least one hydroxide selected from the group consisting of tetramethylammonium hydroxide, tetraethylammonium hydroxide, tetrapropylammonium hydroxide, tetrabutylammonium hydroxide, choline hydroxide, sodium hydroxide, and potassium hydroxide.

5. The process of claim 2 wherein the high-energy radiation is EUV radiation having a wavelength of 3 to 15 nm.

6. The process of claim 2 wherein the high-energy radiation is EB at an accelerating voltage of 1 to 150 keV.

* * * * *